United States Patent
Pressnall et al.

(10) Patent No.: US 6,442,867 B2
(45) Date of Patent: Sep. 3, 2002

(54) APPARATUS AND METHOD FOR CLEANING A VERTICAL FURNACE PEDESTAL AND CAP

(75) Inventors: William Pressnall, Richardson; Frank D. Poag, Plano; Richard L. Guldi, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/737,676

(22) Filed: Dec. 14, 2000

Related U.S. Application Data
(60) Provisional application No. 60/174,324, filed on Jan. 4, 2000.

(51) Int. Cl.[7] .................................................. F26B 5/04
(52) U.S. Cl. ............................ 34/410; 34/389; 134/37; 134/200; 432/152; 432/241; 438/905
(58) Field of Search .......................... 34/380, 389, 404, 34/410, 487, 84, 85, 204, 233; 432/152, 198, 200, 204, 241; 134/37, 198, 200, 902; 438/905

(56) References Cited

U.S. PATENT DOCUMENTS

| | | | |
|---|---|---|---|
| 4,412,812 A | 11/1983 | Sadowski et al. | 432/121 |
| 4,695,706 A | 9/1987 | Mizushina | 219/390 |
| 4,941,489 A * | 7/1990 | Kamimura et al. | 134/95 |
| 5,127,365 A | 7/1992 | Koyama et al. | 118/724 |
| 5,171,972 A * | 12/1992 | Hidano | 219/390 |
| 5,221,201 A * | 6/1993 | Yamaga et al. | 432/241 |
| 5,351,415 A | 10/1994 | Brooks et al. | 34/389 |
| 5,551,165 A | 9/1996 | Turner et al. | 34/404 |
| 5,645,419 A * | 7/1997 | Phsawa et al. | 432/241 |
| 5,698,040 A * | 12/1997 | Guldi et al. | 134/1.3 |
| 5,753,046 A | 5/1998 | Choi et al. | 118/724 |
| 5,829,939 A * | 11/1998 | Iwai et al. | 414/411 |
| 5,838,455 A | 11/1998 | Turner et al. | 134/57 R |
| 5,902,102 A * | 5/1999 | Nam et al. | 432/152 |
| 5,951,282 A | 9/1999 | Sakata et al. | 432/241 |
| 6,225,602 B1 * | 5/2001 | Buijze et al. | 219/390 |

* cited by examiner

*Primary Examiner*—William C. Doerrler
*Assistant Examiner*—Mark Shulman
(74) *Attorney, Agent, or Firm*—Jacqueline J. Garner; W. James Brady, III; Frederick J. Telecky, Jr.

(57) ABSTRACT

A system (10) is disclosed for cleaning a vertical furnace (12) pedestal (34) and cap (36) including at least one inlet conduit (40) in fluid communication with a pressurized cleaning medium source (46). The system also includes at least one exhaust conduit (42) in fluid communication with a negative pressure source (48). A boat assembly (30) may be positioned such that the at least one conduit (40) is operable to direct cleaning medium at the boat assembly (30) to dislodge contaminate particles associated with the boat assembly. The exhaust outlet (42) then evacuates the cleaning medium and any dislodged contaminate particles. The system may operate automatically within a closed processing environment and after each process cycle.

18 Claims, 2 Drawing Sheets

APPARATUS AND METHOD FOR CLEANING A VERTICAL FURNACE PEDESTAL AND CAP

This application claims priority under 35 USC §119(e)(1) of provisional application No. 60/174,324 filed Jan. 4, 2000.

TECHNICAL FIELD

This invention relates in general to the field of electronic devices. More specifically this invention relates to an apparatus and method for cleaning a vertical furnace pedestal and cap.

BACKGROUND OF THE INVENTION

Semiconductor fabrication environments are typically required to maintain high levels of cleanliness. Impurities associated with wafers, processing equipment, and operators may lead to defects in the semiconductor devices manufactured, often rendering them unusable for their intended purpose. These defects often have serious negative effects on product yield and profitability. Semiconductor fabrication typically takes place in so-called clean room environments where operators wear non-linting garments, overshoes, gloves, and masks to limit the introduction of contaminate particles into the fabrication environment. Semiconductor substrate wafers are often processed during fabrication to remove contaminates and impurities.

Vertical furnaces are often used to facilitate high temperature processing of multiple semiconductor substrate wafers. Often, a heated process fluid enters the vertical furnace through an inlet at a bottom portion of the vertical furnace. Process fluid then flows through the vertical furnace before exiting through an exhaust outlet. The vertical furnace typically has an interior cavity sized to allow a wafer carrier assembly, often referred to as a boat assembly, to be loaded inside the cavity and an automated elevator apparatus to insert and remove the boat assembly in and out of the furnace cavity. However, some vertical furnaces may be loaded manually.

The boat assembly supports multiple substrate wafers during processing within a vertical furnace. The boat assembly typically includes a wafer carrier or boat, and a pedestal and a cap that support the boat. The pedestal often includes insulating quartz baffles. Because process fluid typically enters the vertical furnace adjacent to the baffles, impurities and contaminates often collect on the pedestal. Impurities also collect on the pedestal and cap because it may located beneath wafer loading equipment and because particles within the vertical furnace often fall within the interior of the furnace, where the pedestal and cap are located during processing. These impurities can later dislodge and contaminate the substrate wafers being treated within the vertical furnace.

The pedestal and cap can be cleaned manually to remove accumulated contaminate particles. However, this cleaning interrupts fabrication processes, consuming valuable time and resources. Often, manual cleaning is periodic, taking place only after several process runs and after impurities and contaminate particles have built up on the pedestal. Also, manual cleaning within a controlled process environment can disturb the process environment by introducing dislodged impurities and cleaning medium therein.

SUMMARY OF THE INVENTION

In accordance with teachings of the present invention, a system and method for cleaning a vertical furnace pedestal and cap are described which substantially eliminate or reduce disadvantages and problems associated with prior systems and methods. The system includes at least one inlet conduit in fluid communication with a pressurized cleaning medium source. The system also includes at least one exhaust conduit in fluid communication with a negative pressure source. A boat assembly may be positioned such that the at least one conduit is operable to direct a cleaning medium at the boat assembly to dislodge contaminate particles associated with the boat assembly. The exhaust outlet then evacuates the cleaning medium and any dislodged contaminate particles. The system may operate automatically within a closed processing environment. Additionally the system may clean the boat after each process cycle. The exhaust conduit acts to remove the cleaning medium and any dislodged particles to maintain a desired level of cleanliness within the process environment.

In one aspect of the present invention the vertical furnace system includes a boat assembly with a pedestal. The boat assembly is operable to be disposed within a vertical furnace. The system also includes at least one inlet conduit that communicates a cleaning medium from a pressurized cleaning medium source and directs the pressurized cleaning medium at the pedestal to dislodge impurities associated with the pedestal. At least one exhaust conduit is in fluid communication with a negative pressure source and is operable to evacuate the cleaning medium and any dislodged impurities.

More specifically, the boat assembly further includes a boat for securing at least one substrate wafer. The pedestal supports the boat and preferably includes an insulating baffle or disks disposed in a substantially horizontal position spaced from one another. A cap may be coupled to the pedestal distal the boat. The cap is preferably operable to form a seal when disposed adjacent to a bottom portion of the vertical furnace.

In another aspect of the present invention, the system includes at least one inlet conduit and at least one exhaust conduit. The at least one inlet conduit is in fluid communication with a pressurized cleaning medium source operable to direct a pressurized cleaning medium at a boat assembly. The at least one exhaust conduit is in fluid communication with a negative pressure source and is positioned to receive the cleaning medium exiting the at least one inlet conduit.

More specifically at least one flow control device may be disposed between the pressurized cleaning medium source and the at least one inlet conduit. The flow controller may selectively allow a pulse or series of pulses of pressurized cleaning medium to exit the pressurized cleaning medium source and communicate to the at least one inlet conduit.

In yet another aspect of the present invention a method for cleaning a boat assembly during semiconductor processing includes placing the boat assembly in a cleaning position. A pressurized cleaning medium is then directed at the boat assembly to dislodge impurities associated with the boat assembly. The pressurized cleaning medium and any dislodged impurities are then evacuated through an exhaust conduit in fluid communication with a negative pressure source. More specifically, the method includes directing a pressurized pulse of cleaning medium at the boat assembly.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1:
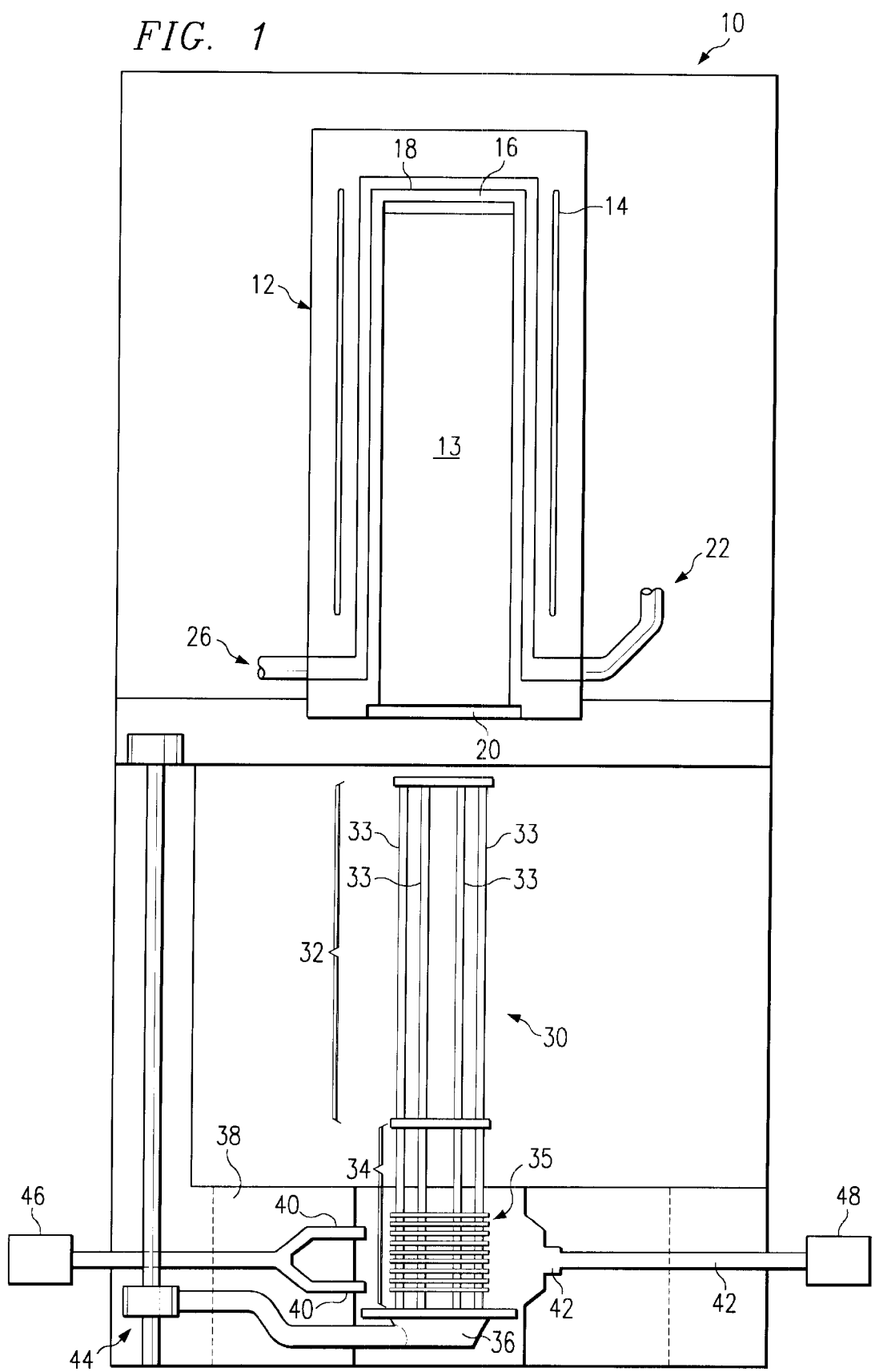
FIG. 1 is a schematic diagram of a semiconductor fabrication apparatus including a vertical furnace and boat assembly incorporating teachings of the present invention.
Figure 2:
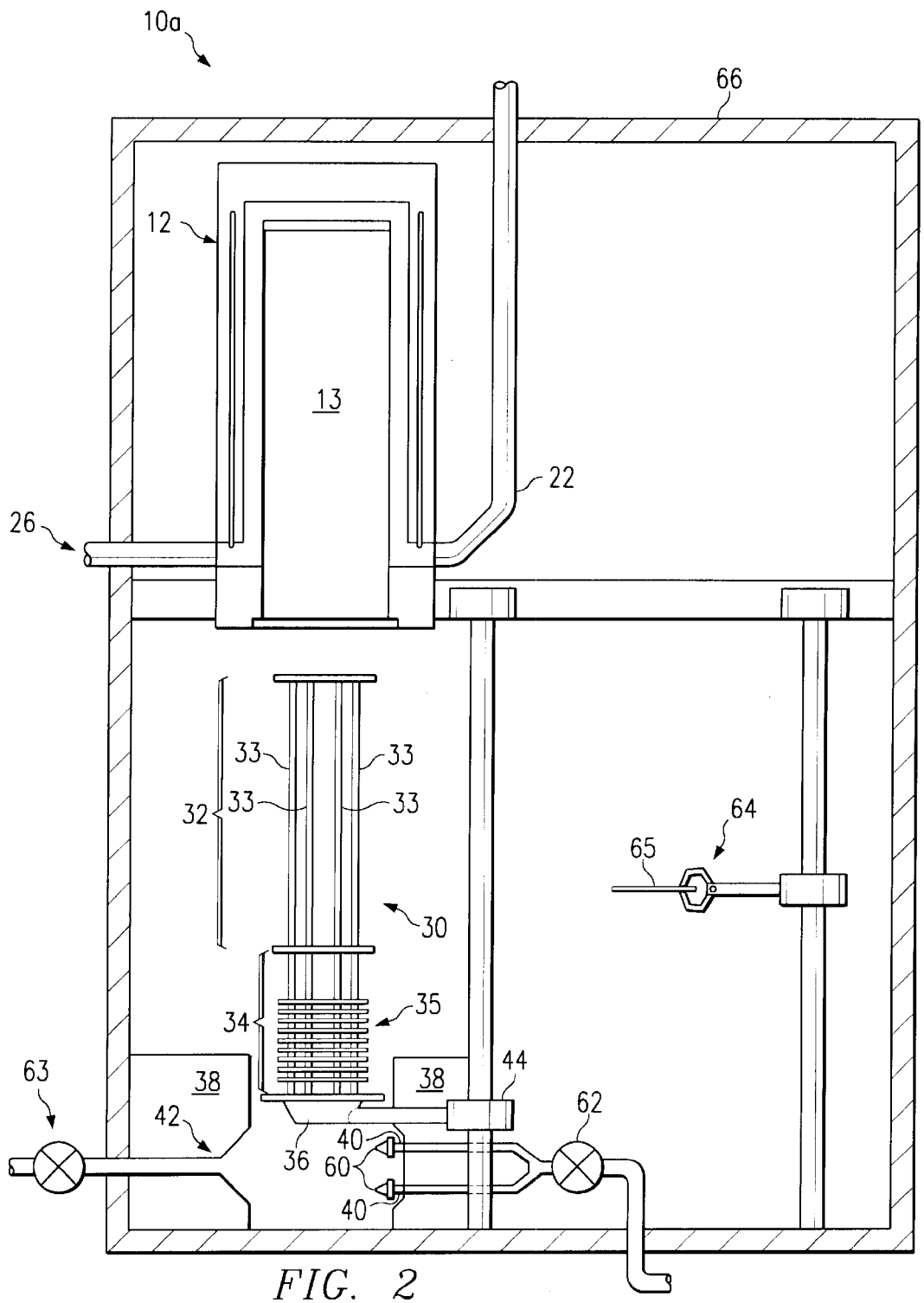
FIG. 2 is a schematic diagram of a semiconductor fabrication apparatus including a loading station incorporating teachings of the present invention.

Preferred embodiments and their advantages are best understood by reference to FIGS. 1 and 2 wherein like numbers are used to indicate like and corresponding parts. FIG. 1 is a schematic diagram of a semiconductor fabrication apparatus indicated generally at 10 including vertical furnace 12 and boat assembly 30 incorporating teachings of the present invention. Vertical furnace 12 includes interior cavity 13, a substantially cylindrical cavity defined by the interior walls of vertical furnace 12. Opening 20 allows boat assembly 30 to be inserted into interior cavity 13. Furnace inlet 22 acts to communicate process fluids into interior cavity 13 for heat treatment processing. Furnace inlet 22 communicates process fluid into a bottom portion of interior cavity 13. Process fluids travel through the interior cavity, around quartz tubes 16 and exits vertical furnace 12 through furnace outlet 26.

Vertical furnace 12 also includes liner 18 and heater element 14. Liner 18 is located radially spaced from interior cavity 13. Heater element 14 is located radially spaced from liner 18. Heater element 14 acts to heat vertical furnace 12 for processing and may be a heating wire wrapped circumferentially around vertical furnace 12 or another suitable heater device. Liner 18 may be a silicon carbide liner.

Boat assembly 30 is preferably coupled to elevator assembly 44. Elevator 44 is operable to raise and lower boat 30 such that boat assembly 30 can be raised into interior cavity 13 or lowered from vertical furnace 12. In an alternative embodiment, elevator assembly 44 may transfer boat assembly to other positions as shown in FIG. 2.

Boat assembly 30 preferably includes boat 32 having a plurality of slotted rods 33 operable to support semiconductor devices (not expressly shown) for processing within vertical furnace 12. Boat 32 extends from pedestal 34. Pedestal 34 includes a baffle assembly 35 in the present embodiment. The baffle assembly 35 is typically made up of a plurality of quartz disks positioned substantially horizontally and spaced from one another. Pedestal 34 is preferably attached to and supported by cap 36. Cap 36 is further coupled to elevator assembly 44. When elevator assembly 44 raises boat assembly 30 into interior cavity 13 of vertical furnace 12, cap 36 preferably contacts opening 20 forming a seal with pedestal 34. Pedestal 34 is preferably positioned adjacent to furnace inlet 22. In the present embodiment the seal between opening 20 and cap 36 may be an air tight seal.

Elevator assembly 44 may selectively lower boat assembly 30 into a cleaning position as shown in FIG. 1. While in this cleaning position, pedestal 34 and cap 36 are substantially surrounded by a cowling or shroud assembly 38. Shroud assembly 38 includes inlet conduits 40 which are preferably in fluid communication with cleaning medium source 46. Cleaning medium source 46 preferably is a pressurized cleaning medium source. Shroud assembly 38 further includes exhaust outlet 42. Exhaust outlet 42 is preferably in fluid communication with negative pressure source 48. Shroud assembly 38 is preferably shaped for directing cleaning medium from inlet conduits 40 to exhaust outlet 42.

In operation, elevator assembly 44 raises boat assembly 30 into interior cavity 13 for desired heat treatment processing. After the heat treatment processing, the boat assembly is preferably removed from vertical furnace 12 and semiconductor devices such as semiconductor substrate wafers are removed from boat assembly 30. Boat assembly 30 is preferably moved into the cleaning position such that inlet conduits 40 may direct cleaning medium from cleaning medium source 46 to pedestal 34 and cap 36.

When cleaning medium is released from cleaning medium source 46, it travels to inlet conduits 40. Cleaning medium directed from inlet conduit 40 interacts with pedestal 34 and cap 36 to dislodge any impurities or contaminant particles associated with pedestal 34 and cap 36. As cleaning medium is released from cleaning medium source 46 exhaust outlet 42 communicates negative pressure from negative pressure source 48. As cleaning medium interacts with pedestal 34, cleaning medium is preferably drawn into exhaust outlet 42 by negative pressure from negative pressure source 48. Negative pressure source 48 acts to evacuate cleaning medium and any dislodged impurities or contaminate particles. Cleaning medium is preferably an inert gas such as nitrogen. In an alternative embodiment, cleaning medium may be clean dry air.

In the present embodiment a pair of inlet conduits 40 are shown. In alternative embodiments, a single inlet conduit may be employed. In further alternative embodiments a plurality of inlet conduits or an array of inlet conduits may be employed to clean pedestal 34. For embodiments in which multiple inlet conduits are used, the inlet conduits may be spaced for selective introduction of cleaning medium from cleaning medium source 46.

The present embodiment discloses a single exhaust outlet 42. In an alternative embodiment, multiple exhaust outlets may be used to evacuate cleaning medium and any dislodged particles or impurities from pedestal 34.

In an alternative embodiment, inlet conduits 40 may be selectively positioned for selectively directing cleaning medium at pedestal 34. In this alternative embodiment inlet conduits may employ flexible tubing or directable nozzles for selectively directing the cleaning medium.

FIG. 2 is a schematic diagram of a semiconductor fabrication apparatus 10a including a loading station 64 according to the teachings of the present invention. The system 10A includes process chamber 66 housing vertical furnace 12, boat assembly 30 and loading assembly 64. A control system (not expressly shown) may be associated with process chamber 66 to selectively regulate the environment within process chamber 66. Vertical furnace 12 includes furnace inlet 22 in fluid communication with vertical furnace 12 and a process fluid source (not expressly shown). Furnace inlet 22 allows for selective introduction of process fluid into vertical furnace 12 for processing. Exhaust conduit 26 is preferably in fluid communication with vertical furnace for allowing process fluids to exit vertical furnace 12.

Boat assembly 30 is preferably coupled to elevator 44. Elevator 44 is operable to raise, lower and rotate pedestal 34 between different positions within process chamber 66. Elevator 44 may raise boat assembly 30 into an interior cavity 13 of vertical furnace 12. Elevator 44 is operable to lower boat assembly 30 into the cleaning position. Elevator 44 is further operable to move boat assembly 30 into a loading position such that loading assembly 64 may load semiconductor devices such as substrate wafers 65 onto boat assembly 30 to process within vertical furnace 12.

Shroud assembly 38 includes inlet conduits 40 in fluid communication with flow controller 62. Flow controller 62 is preferably in fluid communication with cleaning medium source 46 (as shown in FIG. 1). Flow controller 62 is operable to selectively allow cleaning medium to flow from cleaning medium source to inlet conduits 40. Flow controller 62 may be operable to selectively allow a pulse or a plurality of pulses to flow from cleaning medium source 46. Flow controller 62 may be associated with a system controller (not expressly shown) having software operable to selectively operate flow controller 62. Nozzles 60 are preferably coupled to inlet conduits 40 for directing cleaning medium exiting inlet conduits 40 to pedestal 34. Exhaust conduit 42 is positioned to receive cleaning medium exiting inlet conduits 40.

Exhaust outlet 42 is preferably in fluid communication with negative pressure source 48 (as shown in FIG. 1). Exhaust controller 63 is preferably in fluid communication with exhaust outlet 42 and negative pressure source 48. Exhaust controller 63 is preferably operable to selectively communicate negative pressure to exhaust outlet 42. Exhaust controller 63 may be associated with a system controller (not expressly shown) having software operable to selectively operate exhaust controller 63.

In operation, elevator 44 moves boat assembly 30 into a loading position operable for loading assembly 64 to load substrate wafers 65 onto boat 32. Elevator 44 then rotates boat assembly 30 to a position directly beneath vertical furnace 12. Elevator 44 then raises boat assembly 30 such that boat assembly 30 is inserted into interior cavity 13 within vertical furnace 12 and cap 36 contacts and forms a seal with a bottom portion of vertical furnace 12. After processing within vertical furnace 12, elevator 44 lowers boat assembly 30 from vertical furnace 12.

Elevator 44 moves boat assembly 30 to a position adjacent loading assembly 64 such that loading assembly 64 can unload the processed semiconductor devices from boat assembly 30. Boat assembly 30 is then preferably moved to a cleaning position such that pedestal 34 is positioned generally adjacent to inlet conduits 40. Flow controller 62 then allows cleaning medium to be communicated to inlet conduits 40. Flow controller 62 may allow single pulse or a series of pulses of cleaning medium to communicate to inlet conduits 40. Cleaning medium travels through inlet conduits 40 and through nozzles 60.

Cleaning medium exiting nozzles 60 interacts with pedestal 34 and cap 36 such that cleaning medium acts to dislodge contaminate particles and impurities from pedestal 34 and cap 36. When flow controller 62 operates to allow cleaning medium to flow to inlet conduits 40, exhaust controller 63 allows exhaust conduit 42 to communicate with negative pressure source 48 (as shown in FIG. 1). Exhaust controller 63 can allow the negative pressure source to communicate with exhaust outlet 42 before flow controller 62 opens or after. Cleaning medium and any dislodged particles are evacuated through exhaust conduit 42.

In the present embodiment, elevator 44 acts to raise or lower boat assembly 30 or rotate boat assembly 30 into a position for loading. In an alternative embodiment, any suitable transfer mechanism or transfer assembly may be used to move boat assembly 30 from within vertical furnace 12 to loading assembly 64 and to a cleaning position.

Although the disclosed embodiments have been described in detail, it should be understood that various changes, substitutions, and alterations can be made to the embodiments without departing from their spirit and scope.

What is claimed is:

1. A vertical furnace system for semiconductor processing comprising:
    a boat assembly having a pedestal operable to be disposed in a vertical furnace;
    at least one inlet conduit operable to communicate a cleaning medium from a pressurized cleaning medium source;
    the at least inlet conduit further operable to direct the pressurized cleaning medium at the pedestal to dislodge impurities associated with the pedestal; and
    at least one exhaust conduit in fluid communication with a negative pressure source, operable to evacuate the directed cleaning medium and any dislodged impurities.

2. The system of claim 1 wherein the cleaning medium comprises inert gas.

3. The system of claim 1 wherein the cleaning medium comprises nitrogen.

4. The system of claim 1 wherein the cleaning medium comprises clean dry air.

5. The system of claim 1 further comprising an elevator assembly coupled to the boat assembly operable to transfer the boat assembly from the vertical furnace to a cleaning position spaced from the vertical furnace.

6. The system of claim 1 further comprising:
    an elevator assembly operable to transfer the boat assembly from the vertical furnace to a cleaning position spaced from the vertical furnace;
    a shroud assembly operable to surround the pedestal when the boat assembly is placed in the cleaning position; and
    the shroud assembly shaped for directing the cleaning medium from the at least one inlet conduit to the at least one exhaust conduit.

7. The system of claim 1 wherein the boat assembly further comprises:
    a boat for securing at least one substrate wafer;
    the pedestal comprising a plurality of disks disposed in a substantially horizontal position spaced from one another, the pedestal coupled to the boat such that the pedestal supports the boat; and
    a cap coupled to the pedestal distal the cap, the cap operable to form a seal when disposed adjacent to a bottom portion of the vertical furnace.

8. The system of claim 1 further comprising:
    a plurality of inlet conduits operable to communicate the cleaning medium from the cleaning medium source; and
    the plurality of inlet conduits further operable to direct the cleaning medium at the pedestal.

9. The system of claim 1 further comprising a plurality of exhaust conduits in fluid communication with the negative pressure source positioned for receiving the cleaning medium exiting the at least one inlet conduit.

10. The system of claim 1 further comprising:
    a process chamber housing the vertical furnace, the boat assembly, the at least on inlet conduit, and the at least one exhaust conduit; and
    the process chamber operable to regulate the environment within the process chamber.

11. A system for cleaning a vertical furnace used to process semiconductor devices comprising:
    at least one inlet conduit in fluid communication with a pressurized cleaning medium source operable to direct a pressurized cleaning medium at a boat assembly;

at least one exhaust conduit in fluid communication with a negative pressure source;

the exhaust conduit positioned to receive the cleaning medium exiting the at least one inlet conduit;

a shroud assembly associated with the at least one Inlet conduit and the at least one exhaust conduit operable to direct the flow of cleaning medium around a pedestal disposed within the shroud assembly; and the shroud assembly shaped for directing the cleaning medium exiting the at least one inlet conduit to the at least one exhaust conduit.

12. The system of claim 11 wherein the cleaning medium is an inert gas.

13. The system of claim 11 wherein the inlet conduit further comprises a nozzle coupled to the inlet conduit for directing the cleaning medium at the boat assembly.

14. The system of claim 11 further comprising:

at least one flow control device disposed between the pressurized cleaning medium source and the at least one inlet conduit; and the flow controller operable to selectively allow at least one pulse of pressurized cleaning medium to exit the pressurized cleaning medium source and communicate with the at least one inlet conduit.

15. A method for leaning a vertical furnace boat assembly during semiconductor processing comprising:

placing the boat assembly in a cleaning position;

directing a pressurized cleaning medium at the boat assembly to dislodge impurities associated with the boat assembly;

evacuating the pressurized cleaning medium and any dislodged impurities through an exhaust conduit in fluid communication with a negative pressure source; and directing the pressurized cleaning medium at a pedestal supporting the boat assembly.

16. The method of claim 15 wherein the cleaning medium comprises an inert gas.

17. The method of claim 15 further comprising:

moving the boat assembly to a loading position;

loading at least one substrate wafer onto the boat assembly;

placing the boat assembly in an interior cavity of a vertical furnace;

processing the at least one substrate wafer within the vertical furnace;

moving the boat assembly to the loading position;

unloading the at least one substrate wafer; and repeating the placing the boat assembly in a cleaning position, directing the cleaning medium, and evacuating the cleaning medium.

18. The method of claim 15 wherein said directing further comprises directing at least one pressurized pulse of cleaning medium.

* * * * *